United States Patent
Bergervoet et al.

(10) Patent No.: US 8,737,449 B2
(45) Date of Patent: May 27, 2014

(54) FREQUENCY HOPPING RECEIVER CIRCUIT

(75) Inventors: Jozef Reinerus Maria Bergervoet, Eindhoven (NL); Harish Kundur Subramaniyan, Eindhoven (NL); Remco Cornelis Herman Van De Beek, Eindhoven (NL)

(73) Assignee: NXP, B.V., Eindhoven (NL)

( * ) Notice: Subject to any disclaimer, the term of this patent is extended or adjusted under 35 U.S.C. 154(b) by 171 days.

(21) Appl. No.: 13/060,694

(22) PCT Filed: Aug. 18, 2009

(86) PCT No.: PCT/IB2009/053637
§ 371 (c)(1),
(2), (4) Date: Feb. 25, 2011

(87) PCT Pub. No.: WO2010/023597
PCT Pub. Date: Mar. 4, 2010

(65) Prior Publication Data
US 2011/0150043 A1     Jun. 23, 2011

(30) Foreign Application Priority Data

Sep. 1, 2008 (EP) .................... 08163432
Aug. 18, 2010 (WO) ............... PCT/IB2009/053637

(51) Int. Cl.
*H04B 1/00* (2006.01)

(52) U.S. Cl.
USPC ...... 375/136; 375/132; 375/316; 375/E1.033; 455/323

(58) Field of Classification Search
None
See application file for complete search history.

(56) References Cited

U.S. PATENT DOCUMENTS

| 6,941,110 B2 | 9/2005 | Kloper et al. |
| 7,693,237 B2 * | 4/2010 | Mehrnia et al. ............ 375/316 |

(Continued)

FOREIGN PATENT DOCUMENTS

| EP | 0 405 349 A2 | 1/1991 |
| EP | 0 630 106 A1 | 12/1994 |

(Continued)

OTHER PUBLICATIONS

Roovers, R., et al.: "An Interface-Robust Receiver for Ultra-Wideband Radio in SiGe BiCMOS Technology," IEEE J. of Solid-State Circuits, vol. 40, No. 12, pp. 2563-2572 (Dec. 2005).

(Continued)

*Primary Examiner* — Adolf Dsouza

(57) ABSTRACT

A frequency hopping receiver circuit has a frequency converter (12) and a hopping control circuit (14) coupled to the frequency converter (12), and configured to control frequency hopping of the received frequency, by controlling changes in frequency shift applied by the frequency converter (12). The frequency change is applied in combination with a temporary reduction in conversion gain of the frequency converter (12) during the change in frequency shift. The frequency converter may contain a mixer (122), a local oscillator circuit (120) and a controllable amplifier (124) coupled between the input of the frequency converter (12) and the mixer (122) or between the mixer (122) and the output of the frequency converter (12), or between the local oscillator circuit (120) and the local oscillator input of the mixer (122). In this case the hopping control circuit (14) has outputs coupled to a gain control input of the controllable amplifier (124) and a frequency control input of the local oscillator circuit (120), to control the reduction in conversion gain and the change in frequency shift respectively.

15 Claims, 3 Drawing Sheets

(56) References Cited

U.S. PATENT DOCUMENTS

2007/0076783 A1     4/2007   Dishman et al.
2008/0014895 A1*   1/2008   Li et al. ................ 455/324
2008/0253431 A1     10/2008   Ohba

FOREIGN PATENT DOCUMENTS

EP     1 296 449 A1     3/2003
JP     01-202031 A     8/1989
JP     7057764 A     3/1995

OTHER PUBLICATIONS

Andren, C. "A Comparison of Frequency Hopping and Direct Sequence Spread Spectrum Modulation for IEEE 802.11 Applications at 2.4 GHz," Internet Citation retrieved from: http://sss-mag.com/pdf/ds-v-fh.pdf, 8 pgs., (Apr. 11, 1997).
International Search Report and Written Opinion for Int'l. Patent Appln. No. PCT/IB2009/053637 (Dec. 11, 2009).

* cited by examiner

FREQUENCY HOPPING RECEIVER CIRCUIT

FIELD OF THE INVENTION

The invention relates to a frequency hopping receiver circuit.

BACKGROUND OF THE INVENTION

Frequency hopping reception may be used to reduce the effect of narrow band interfering signals. During frequency hopping reception the frequency of the reception band of a receiver is changed in successive hops. Thus reception bands at different frequencies are received respectively in successive time intervals. This has the effect that the distance between the reception band and the frequency of the interfering signal varies from time interval to time interval, only a few time intervals suffering strongly from the interference.

European Patent application No. 630106 describes a frequency hopping receiver. This document addresses the gain used in the receiver. An automatic gain control circuit is used, which adapts the gain to the observed signal strength. The document notes that the gain adaptation may be problematic due to amplitude changes at the transitions between time intervals with reception bands at different frequencies. This problem is addressed by imposing limits on the gain range of the automatic gain control during the time intervals. The limits may set dependent on the hops, so that different gain ranges can be used in different time intervals.

It has been found that interference may occur in such receivers even when the frequency of the reception bands stay away from the frequency of the interfering signal. Error correction circuitry typically corrects for such interference, but this reduces error correction capacity, or requires unnecessarily heavy error correction.

SUMMARY OF THE INVENTION

Among others, it is an object to reduce the effect of interfering signals in a frequency hopping receiver.

A frequency hopping receiver circuit according to claim 1 is provided. This circuit comprises a frequency converter that is used to apply time varying frequency shifts to a received signal. In an embodiment the frequency converter may contain a mixer and a local oscillator whose frequency is changed to vary the frequency shift. A hopping control circuit is coupled to the frequency converter. The hopping control circuit controls a change or changes in the applied frequency shift. The hopping control circuit combines the frequency shift or shifts with a temporary reduction in conversion gain of the frequency converter (12) during the change in frequency shift. This reduces effects of broadening of the shifted spectrum of the interferer during the change of frequency shift.

In the embodiment wherein a mixer and a local oscillator and are used to provide the frequency shifts, a controllable amplifier is coupled between the input of the frequency converter and the mixer or between the mixer and the output of the frequency converter, or between the local oscillator circuit and the local oscillator input of the mixer may be used. During the change of frequency shift the gain of this amplifier is reduced to reduce the conversion gain.

In an embodiment the gain is sloped down before the change in frequency shift and sloped up the gain after the change in frequency shift. In this way effects of sudden gain changes are reduced, while still covering a main time interval with the change of frequency shift wherein the interference could become a problem.

In an embodiment a delay circuit is used between the circuit that determines the time of the frequency hop, to delay transmission of signals to the shift control input relative to transmission to a conversion gain control input. In this way the gain reduction can be realized starting from a time point before the change of frequency shift. In an embodiment time counter may be used to determine the time of the frequency hop and time values of the counter may be used to control timing of both the reduction in gain and the change in frequency shift.

In an embodiment the hopping control circuit is coupled to the automatic gain control circuit to disable automatic gain control during the reduction of conversion gain. In this way it is prevented that the automatic action of the automatic gain control (AGC) could undo the reduction of the gain.

In an embodiment a quadrature mixer circuit is used and the controllable amplifier that is used to reduce the gain is coupled between an input of the frequency converter and the quadrature mixer circuit. Thus one gain reduction may suffice for both quadrature components.

BRIEF DESCRIPTION OF THE DRAWINGS

These and other objects and advantageous aspects will be become apparent from a description of exemplary embodiments, using the following Figures.

DETAILED DESCRIPTION OF THE EMBODIMENTS

Figure 1:
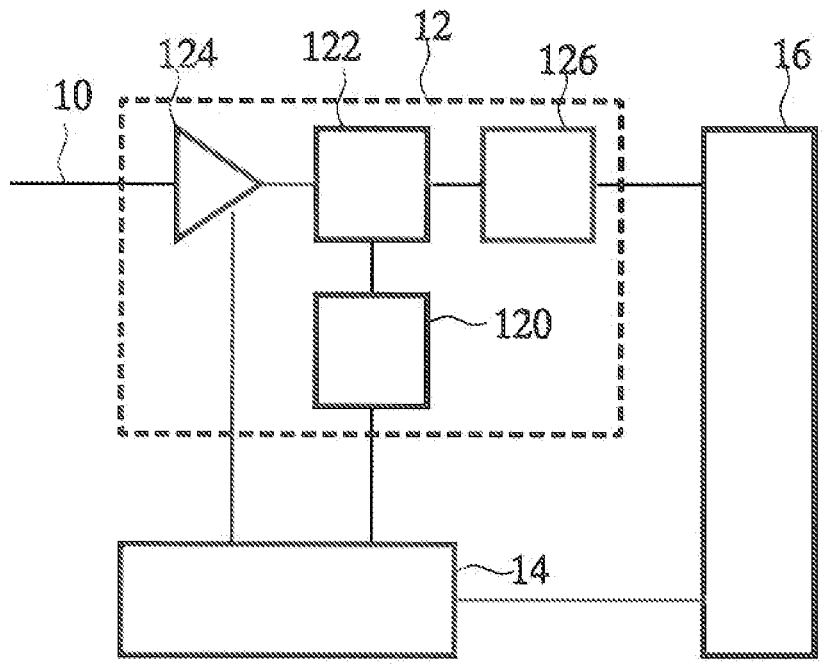
FIG. 1 shows a frequency hopping receiver
FIGS. 2a,b show a frequency and gain as a function of time

FIG. 1 shows a frequency hopping receiver, with a receiver input 10, a frequency converter 12, a hopping control circuit 14 and a demodulation/decoding circuit 16. Receiver input 10 is coupled to demodulation/decoding circuit 16 via frequency converter 12. Demodulation/decoding circuit 16 has an output coupled to a control input of hopping control circuit 14, which in turn has outputs coupled to frequency and amplitude control inputs of frequency converter 12.

Frequency converter 12 comprises a local oscillator circuit 120, a mixer circuit 122, a controllable amplifier 124 and a filter 126. Receiver input 10 is coupled to a first input of mixer circuit 122 via controllable amplifier 124. An output of local oscillator circuit 120 is coupled to a second input of mixer circuit 122. An output of mixer circuit 122 is coupled to demodulation/decoding circuit 16 via filter 126. The frequency and amplitude control outputs of hopping control circuit 14 are coupled to a frequency control input of local oscillator 120 and a gain control input of controllable amplifier 124 respectively.

In operation frequency converter 12 shifts the frequency of a received signal by a time dependent frequency offset. The frequency offset equals the frequency supplied by local oscillator 120 to mixer circuit 122. Hopping control circuit 14 causes the frequency offset to hop, i.e. it signals a series of successive time intervals and in each time interval it selects a frequency of local oscillator circuit 120.

Figure 2A:
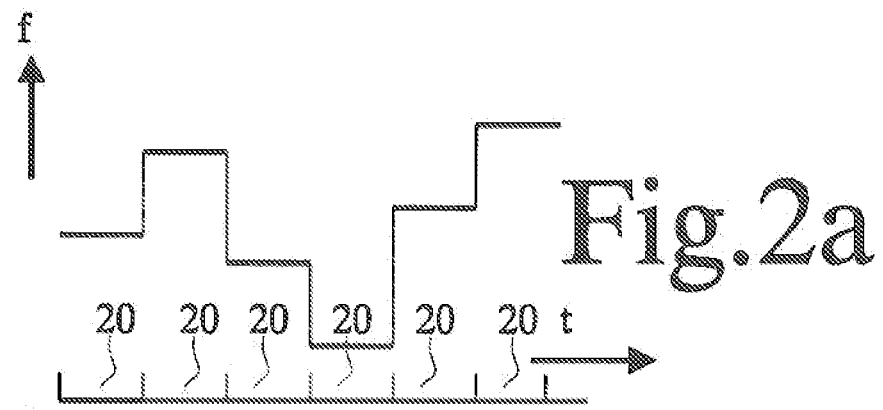

FIG. 2a shows the local oscillator frequency as a function of time. Successive time intervals 20 are indicated, wherein hopping control circuit 14 controls local oscillator circuit 120 to output local oscillator signals of respective different frequencies.

In addition to causing the frequency hops, hopping control circuit 14 controls controllable amplifier 124 to reduce its gain temporarily at the transitions between the time intervals 20.

Figure 2B:
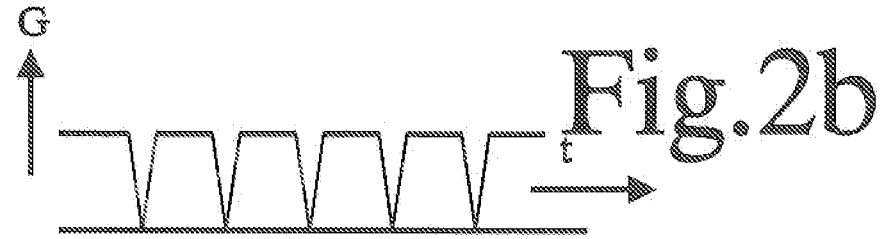

FIG. 2b shows the gain of controllable amplifier 124 as a function of time. As can be seen the same normal gain level is used during the major part of each time interval 20. Before the transition between the time intervals 20, hopping control circuit 14 controls controllable amplifier 124 controls controllable amplifier 124 to slope down the gain from this normal gain level to a lower level. The lower level may be a factor 10 or more down from the normal gain level. After the transition controllable amplifier 124 controls controllable amplifier 124 to slope up the gain from the lower level back to the normal gain level.

Although an embodiment is shown wherein the normal gain level in each time interval 20 is the same, it should be appreciated that in more complex embodiments different normal gain levels may be used in different time intervals 20, or that a variable feedback controlled gain may be used during the time interval. In this embodiment controllable amplifier 124 is an automatic gain control circuit (AGC). In this embodiment, gain control is disabled at the transitions between time intervals to force the gain down. The gain may even be kept low in certain time intervals. Thus, at some transitions no slope up and/or slope down of the gain may be used. However, during at least part of the transitions between time intervals a slope up and a slope down are used as shown, although the normal gain levels before slope down and after slope up may differ.

An effect of the reduction in gain is that the amplitude of interfering signals will be reduced at the time when the local oscillator frequency is changed between successive time intervals. This prevents wideband signal components due to the effect of mixing such an interfering signal with a local oscillator signal of changing frequency. By using a gain that is sloped down and up instead of switched down and up it is prevented that the gain change introduces wide band signals. The slope may be selected thus that the time needed to slope down from the normal gain level to the lower level is at least as large as the inverse of the bandwidth of filter 126. Similarly the time needed to slope up from the lower level to the normal gain level is at least so large as well. The gain may be kept at or near the lower gain level for a duration that is sufficient to ensure that the change in frequency between the time intervals occurs during this duration. Such a duration may be omitted altogether, if the drop and rise are timed with sufficient accuracy.

Figure 3:
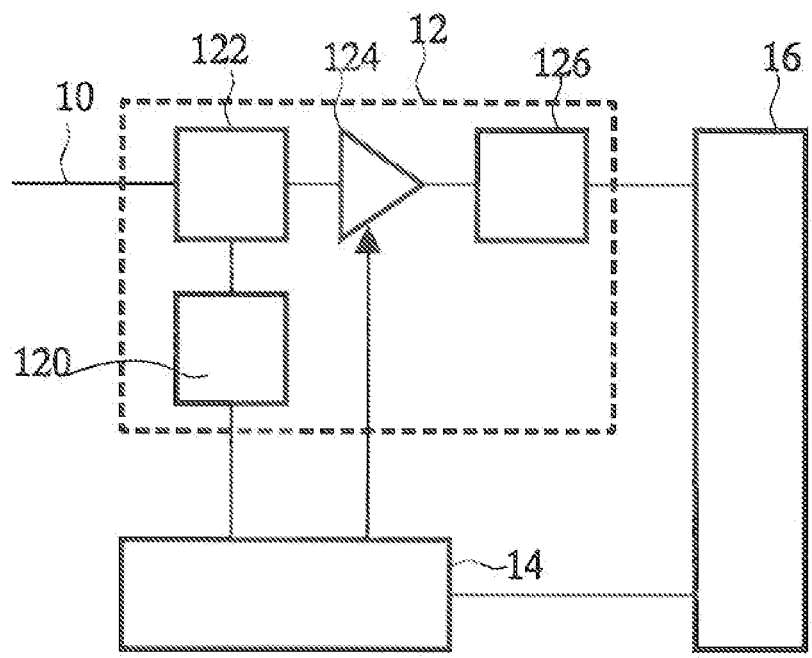
FIGS. 3 and 4 shows a frequency hopping receiver
Figure 4:
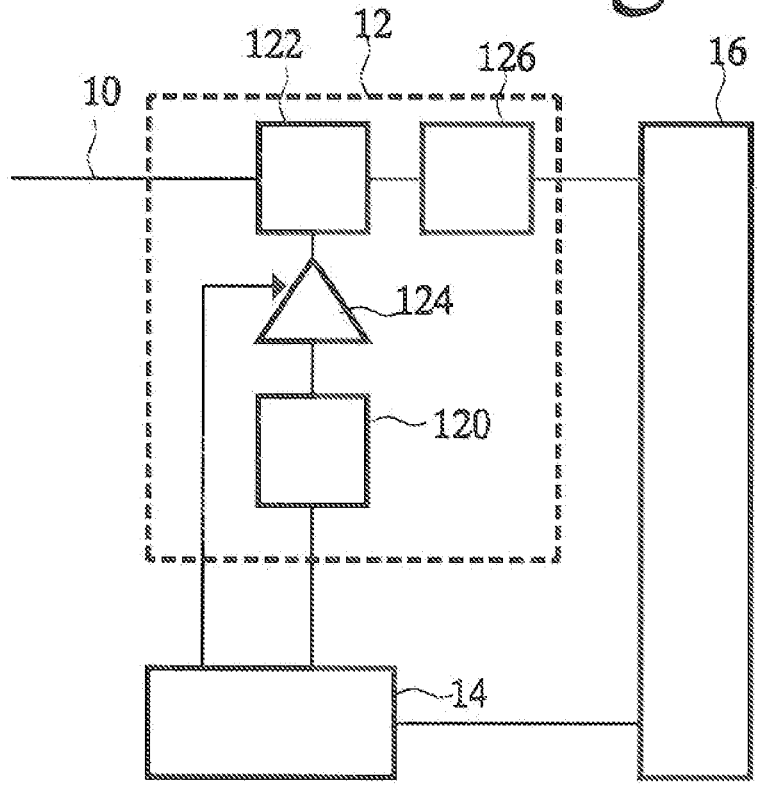

FIG. 3 shows an alternative embodiment, wherein controllable amplifier 124 is included behind mixer circuit 122. FIG. 4 shows an alternative embodiment, wherein controllable amplifier 124 is included between local oscillator 120 and mixer circuit 122. Here mixer circuit 122 is a multiplier that multiplies the received signal and the local oscillator signal.

It should be appreciated that various more elaborate configurations are possible. For example, in a quadrature receiver a pair of mixer circuits may be used, receiving respective mutually phase shifted local oscillator signals. In this case a common controllable amplifier 124 may be used to supply the received signal to both mixer circuits. Alternatively, a plurality of controllable amplifiers may be used behind the respective mixer circuits, or between the respective mixer circuits and the local oscillator circuit.

The frequency hops may be realized by changing a frequency adjustment signal applied to local oscillator circuit 120, or changing a frequency setting. Alternatively, local oscillator circuit 120 may contain a plurality of oscillators, for producing signals of respective frequencies and a switching circuit that connects the input of mixer circuit 122 to a selectable one of the oscillators. In this embodiment hopping control circuit 14 controls the switching circuit. Optionally, hopping control circuit 14 also controls the frequency setting of the oscillators in this case. Instead a plurality of mixer circuits may be used, each with its own oscillator and a switching circuit between the mixer circuits and filter 126, for connecting the output of a selectable one of the mixers circuit to filter 126.

Figure 5:
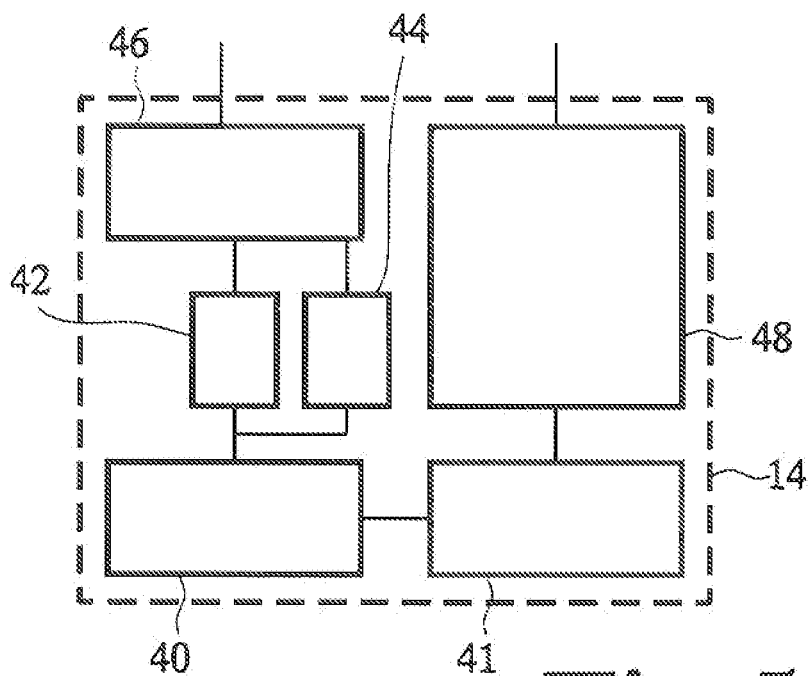
FIG. 5 shows a hopping control circuit

FIG. 5 shows an embodiment of hopping control circuit 14. In this embodiment hopping control circuit 14 comprises a first and second counter 40, 41, a first and second count detector 42, 44, a pulse shaper 46 and a frequency selection table circuit 48. First counter 40 serves to count the time within time intervals 20. Thus, first counter forms a hop time selection circuit, with an output that determines the time points when hops occur. Second counter 41 serves to distinguish the time intervals, and may be incremented each time when first counter 40 indicates that the end of a time interval 20 has been reached. Second counter 41 addresses a frequency in frequency selection table circuit 48. Frequency selection table circuit 48 outputs a control signal to the local oscillator circuit (not shown) to select the frequency addressed by second counter. The frequencies may follow an irregular hopping pattern as a function of the address.

First and second count detector 42, 44, serve to detect respective count values of first counter 40 a predetermined first number of count values (e.g. 1 or a higher number) before and a predetermined second number of count values (e.g. 1 or a higher number) after reaching the end of each time interval 20 respectively. Thus, second count detector 44 cooperates with first counter 40 to act as a delay circuit, which produces an output with a delay after the time point of hopping. Pulse shaper 46 serves to supply sloping control signals to controllable amplifier 124.

Figure 5A:
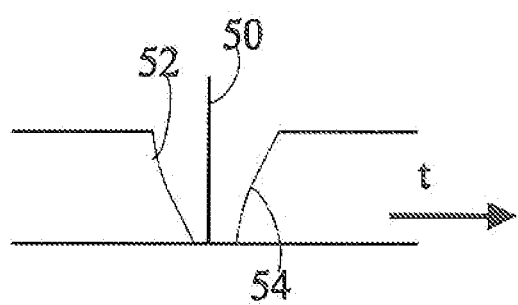
FIG. 5a illustrates up and down sloping of conversion gain

FIG. 5a shows an example of a pulse, with a line 50 marking the time of the change of the frequency shift produced by frequency converter 12, and slopes 52, 54 of the gain before and after the change of the frequency shift. First count detector 42 is coupled to pulse shaper 46 at an input to cause it to slope its output signal down with a slope 52 from a value that selects the normal gain level to a value that selects the low gain level. First count detector 42 causes pulse shaper 46 to do so when it detects from the count value of first counter 40 that it has reached a count value a first predetermined number of clock cycles before reaching the end of a time interval 20 at the time indicated by line 50. Second count detector 44 is coupled to pulse shaper 46 at an input to cause it to slope its output signal up with a slope 54 from the value that selects the lowered gain level to a value that selects the normal gain level. Second count detector 44 causes pulse shaper 46 to do so when it detects from the count value of first counter 40 that it has reached a count value a second predetermined number of clock cycles after reaching the end of a time interval 20 at the time indicated by line 50. In other words, first counter 40 serves to delay the frequency transition after first count detector 42 triggers the gain to slope down.

It should be appreciated that there are many other ways of adjusting the gain at the transition between the time intervals 20. For example, a slowly responding controllable gain amplifier may be used, instead of a pulse shaper, with an inherent delay circuit effect. Instead of a pulse shaper a digital to analog conversion circuit may be used to generate a programmable slope. A common signal may be used to trigger the gain change and the frequency change, in which case the common signal may be passed through a delay circuit to delay frequency switching.

Input 10 may be directly or indirectly coupled to an antenna (not shown). The circuit may be integrated in an integrated circuit. Input 10 may be an external input of such an integrated circuit, but it may also be internal, the integrated circuit comprising a pre-processing circuit (e.g. an RF front end) before the input.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A frequency hopping receiver circuit, comprising:
a frequency converter; and
a hopping control circuit coupled to the frequency converter, and configured to control a change in frequency shift applied by the frequency converter in combination with a temporary reduction in conversion gain of the frequency converter during the change in frequency shift, wherein the hopping control circuit is configured to slope down the gain before the change in frequency shift and to slope up the gain after the change in frequency shift,
wherein the frequency converter has a frequency shift control input and a conversion gain control input, the hopping control circuit comprising a hop time selection circuit coupled to the frequency shift control input and the conversion gain control input, the hopping control circuit comprising a delay circuit, coupled between the hop time selection circuit and the shift control input and configured to delay transmission of signals from the hop time selection circuit to the shift control input relative to transmission of signals to the conversion gain control input.

2. A frequency hopping receiver circuit according to claim 1 wherein the frequency converter comprises:
a mixer coupled between an input and an output of the frequency converter,
a local oscillator circuit coupled to a local oscillator input of the mixer and
a controllable amplifier coupled between the input of the frequency converter and the mixer or between the mixer and the output of the frequency converter, or between the local oscillator circuit and the local oscillator input of the mixer,
the hopping control circuit having outputs coupled to a gain control input of the controllable amplifier and a frequency control input of the local oscillator circuit, to control the reduction in conversion gain and the change in frequency shift respectively.

3. A frequency hopping receiver circuit according to claim 2, further comprising a further mixer having a local oscillator input coupled to a quadrature signal output of the local oscillator circuit, the controllable amplifier being coupled between an input of the frequency converter on one side and inputs of the mixer and the further mixer on the other side.

4. A frequency hopping receiver circuit according to claim 1, the hopping control circuit comprising a hop time counter coupled to the frequency shift control input and the conversion gain control input, the hop time counter controlling timing of both the reduction in gain and the change in frequency shift.

5. A frequency hopping receiver circuit according to claim 1, further comprising an automatic gain control circuit coupled between an input and an output of the frequency converter, the hopping control circuit being coupled to the automatic gain control circuit to disable automatic gain control during the reduction of conversion gain.

6. A method of frequency hopping reception, comprising:
converting a frequency of an input signal by applying a frequency shift that changes at successive time points, and
reducing a conversion gain temporarily during the changes in frequency shift, including sloping down the conversion gain before a change in frequency shift and sloping up the conversion gain after the change in frequency shift and delaying transmission of signals from a hop time selection circuit to a shift control input relative to transmission of signals to a conversion gain control input.

7. The method of claim 6, further comprising disabling automatic gain control during the reduction of the conversion gain.

8. A frequency hopping receiver circuit, comprising:
a frequency converter;
a hopping control circuit coupled to the frequency converter, and configured to control a change in frequency shift applied by the frequency converter in combination with a temporary reduction in conversion gain of the frequency converter during the change in frequency shift; and
an automatic gain control circuit coupled between an input and an output of the frequency converter, the hopping control circuit being coupled to the automatic gain control circuit to disable automatic gain control during the reduction of conversion gain.

9. A frequency hopping receiver circuit according to claim 8 wherein the frequency converter comprises:
a mixer coupled between an input and an output of the frequency converter,
a local oscillator circuit coupled to a local oscillator input of the mixer and
a controllable amplifier coupled between the input of the frequency converter and the mixer or between the mixer and the output of the frequency converter, or between the local oscillator circuit and the local oscillator input of the mixer,
the hopping control circuit having outputs coupled to a gain control input of the controllable amplifier and a frequency control input of the local oscillator circuit, to control the reduction in conversion gain and the change in frequency shift respectively.

10. A frequency hopping receiver circuit according to claim 9, further comprising a further mixer having a local oscillator input coupled to a quadrature signal output of the local oscillator circuit, the controllable amplifier being coupled between an input of the frequency converter on one side and inputs of the mixer and the further mixer on the other side.

11. A frequency hopping receiver circuit according to claim 8, wherein the hopping control circuit is configured to slope down the gain before the change in frequency shift and to slope up the gain after the change in frequency shift.

12. A frequency hopping receiver circuit according to claim 11, wherein the frequency converter has a frequency shift control input and a conversion gain control input, the hopping control circuit comprising a hop time selection circuit coupled to the frequency shift control input and the conversion gain control input, the hopping control circuit comprising a delay circuit, coupled between the hop time selection circuit and the shift control input and configured to delay transmission of signals from the hop time selection circuit to the shift control input relative to transmission of signals to the conversion gain control input.

13. A frequency hopping receiver circuit according to claim 11, wherein the frequency converter has a frequency shift control input and a conversion gain control input, the hopping control circuit comprising a hop time counter coupled to the frequency shift control input and the conversion gain control input, the hop time counter controlling timing of both the reduction in gain and the change in frequency shift.

14. A frequency hopping receiver circuit, comprising:
a frequency converter; and
a hopping control circuit coupled to the frequency converter, and configured to control a change in frequency shift applied by the frequency converter in combination with a temporary reduction in conversion gain of the frequency converter during the change in frequency shift,
wherein the hopping control circuit is configured to slope down the gain before the change in frequency shift and to slope up the gain after the change in frequency shift, wherein the frequency converter has a frequency shift control input and a conversion gain control input, the hopping control circuit comprising a hop time counter coupled to the frequency shift control input and the conversion gain control input, the hop time counter controlling timing of both the reduction in gain and the change in frequency shift.

15. A frequency hopping receiver circuit, comprising:
a frequency converter; and
a hopping control circuit coupled to the frequency converter, and configured to control a change in frequency shift applied by the frequency converter in combination with a temporary reduction in conversion gain of the frequency converter during the change in frequency shift,
wherein the frequency converter comprises:
a mixer coupled between an input and an output of the frequency converter,
a local oscillator circuit coupled to a local oscillator input of the mixer and
a controllable amplifier coupled between the input of the frequency converter and the mixer or between the mixer and the output of the frequency converter, or between the local oscillator circuit and the local oscillator input of the mixer,
the hopping control circuit having outputs coupled to a gain control input of the controllable amplifier and a frequency control input of the local oscillator circuit, to control the reduction in conversion gain and the change in frequency shift respectively,
wherein the frequency hopping receiver circuit further comprises a further mixer having a local oscillator input coupled to a quadrature signal output of the local oscillator circuit, the controllable amplifier being coupled between an input of the frequency converter on one side and inputs of the mixer and the further mixer on the other side.

* * * * *